US007569309B2

(12) United States Patent  
Blatchford et al.

(10) Patent No.: US 7,569,309 B2  
(45) Date of Patent: Aug. 4, 2009

(54) GATE CRITICAL DIMENSION VARIATION BY USE OF GHOST FEATURES

(75) Inventors: James Walter Blatchford, Richardson, TX (US); Benjamen Michael Rathshack, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 519 days.

(21) Appl. No.: 11/269,633

(22) Filed: Nov. 9, 2005

(65) Prior Publication Data

US 2007/0105387 A1    May 10, 2007

(51) Int. Cl.  
*G03F 1/00* (2006.01)
(52) U.S. Cl. .......................................................... 430/5
(58) Field of Classification Search ...................... 430/5, 430/394; 716/19, 21  
See application file for complete search history.

(56) References Cited

U.S. PATENT DOCUMENTS

| 6,046,792 | A   |   | 4/2000  | Van Der Werf et al. |
|-----------|-----|---|---------|---------------------|
| 6,709,923 | B2  | * | 3/2004  | Chung ........................ 438/257 |
| 6,792,591 | B2  | * | 9/2004  | Shi et al. ...................... 716/19 |
| 6,915,505 | B2  | * | 7/2005  | Hsu et al. ..................... 716/19 |
| 2006/0259893 | A1 | * | 11/2006 | Fujimoto ..................... 716/19 |

* cited by examiner

*Primary Examiner*—Stephen Rosasco  
(74) *Attorney, Agent, or Firm*—Wade J. Brady, III; Frederick J. Telecky, Jr.

(57) ABSTRACT

According to various embodiments, the present teachings include various methods for forming a semiconductor device, computer readable medium for forming a semiconductor device, mask sets for forming a semiconductor device, and a semiconductor device made according to various methods. For example, a method can comprise forming a first feature and a second feature on a substrate by exposing a first mask to a first beam, wherein the second feature is disposed adjacent to the first feature, exposing a second mask to a second beam, and removing the second feature from the substrate.

6 Claims, 11 Drawing Sheets

US 7,569,309 B2

GATE CRITICAL DIMENSION VARIATION BY USE OF GHOST FEATURES

DESCRIPTION OF THE INVENTION

1. Field of the Invention

The subject matter of this invention relates to photolithography for forming integrated circuit devices. More particularly, the subject matter of this application relates to methods and devices used to improve gate critical dimension variation.

2. Background of the Invention

Lithographic projection apparatus (tools) can be used, for example, in the manufacture of integrated circuits (ICs). When using the various tools, a mask can be used that contains a circuit pattern corresponding to an individual layer of the IC, and this pattern, usually having many designs, can be imaged onto a target portion (e.g., comprising one or more dies) on a substrate, such as a silicon or other wafer comprising a semiconductor, that has been coated with a layer of radiation-sensitive material, such as a resist. In general, a single wafer may contain a network of adjacent target portions that can be successively irradiated using a projection system of the tool, one at a time. In one type of lithographic projection apparatus, each target portion is irradiated by exposing the entire mask onto the target portion in one shot. In another apparatus, which is commonly referred to as a step-and-scan apparatus, each target portion is irradiated by progressively scanning the mask under the projection beam in a given reference direction (the "scanning" direction) while synchronously scanning the substrate table parallel or anti-parallel to the scanning direction. Because the projection system typically has a magnification factor M, which is generally less than 1, the speed V at which the substrate table is scanned will be a factor M times that at which the mask table is scanned. More information about lithographic apparatus can be found, for example, in U.S. Pat. No. 6,046,792, which is incorporated by reference herein in its entirety.

In a manufacturing process using a lithographic projection apparatus, a mask can be imaged onto a substrate that is at least partially covered by a layer of resist. Prior to this imaging step, the substrate may undergo various procedures, such as, priming, resist coating, and a soft bake. After exposure, the substrate can be subjected to other procedures, such as a post-exposure bake (PES), development, a hard bake, and a measurement/inspection of the imaged features. This array of procedures can be used as a basis to pattern an individual layer of a device, such as an IC. Such a patterned layer may then undergo various processes, such as etching, ion implantation, doping, metallization, oxidation, chemical mechanical polishing (CMP), etc., all intended to complete an individual layer. If several layers are required, then part or all of the procedure, or a variant thereof, may need to be repeated for each new layer. Eventually, multiple devices can be present on the substrate. These devices can then be separated from one another by a technique such as dicing or sawing. Thereafter, the individual devices can be mounted on a carrier, connected to pins, etc.

The lithographic tool may be of a type having two or more substrate tables (and/or two or more mask tables). In such "multiple stage" tools, the additional tables may be used in parallel, or preparatory steps may be carried out on one or more tables while one or more other tables are being used for exposure.

The photolithography masks referred to above comprise geometric designs, also called mask features, corresponding to the circuit components or structures to be integrated onto a substrate. The layouts used to create such masks are typically generated using computer-aided design (CAD) programs, sometimes called electronic design automation (EDA). Most CAD programs follow a set a predetermined design rules in order to create functional masks. These rules are set by processing and design limitations. Design rules can define the space tolerance between circuit devices, such as, for example, gates, contact holes, or interconnect lines, so as to ensure that the circuit devices or lines do not interact with one another in an undesirable way.

One of the goals in IC fabrication is to faithfully reproduce the original circuit design on the wafer using the mask. Another goal is to use as much of the wafer real estate as possible. As the size of an IC is reduced and its density increases, however, the critical dimension (CD) of its corresponding mask approaches the resolution limit of the optical exposure tool. The resolution for an exposure tool can be defined as the minimum feature sizes that the exposure tool can repeatedly expose on the wafer. The resolution value of present exposure tools often constrains the CD for many advanced IC designs.

Further, transistor matching requirements for advanced technology nodes, such as less than 1.0 µm, require exquisite CD control, beyond the capability of current lithography and etch tools and processes. An important component of variation is matching between gates in the interior of an array of active gates, e.g., over the same active region, and those on the end of the array. For example, for the 45 nm technology node, the CD variation for the end gates in an array of gates can be a factor of 2 to 3 times larger than that of the interior active gates of the array.

For example, FIG. 1A shows a conventional gate array 100 having end gates 110a and 110b and interior gates 120a, 120b, and 120c formed on substrate 130. Conventional gate array 100 is formed using a conventional lithography process. As shown in FIG. 1A, the conventional process forms end gates 110a and 110b that are 2 to 3 times larger than interior gates 120a-c.

In some instances, dummy gates, such as dummy gates 110a and 110b shown in FIG. 1B, are formed on a substrate 130. In conventional processes, dummy gates remain on the wafer even after the device is complete. Because the dummy gates reside on the wafer throughout the process, they are processed in a similar way as active gates are processed. For example, after being formed, sidewall spacers 112 are formed on the sides of the dummy gates 110a and 110b. Dummy gates too close to active gates lead to the dummy gates interfering with the device performance. In an attempt to compensate for this interference, dummy gates must be formed far away from the active gates, as shown in FIG. 1B. As such, dummy gates are spaced at pitches significantly different than the pitch of active gates. Moreover, dummy gates take up valuable real estate on the chip.

Thus, there is a need to overcome these and other problems of the prior art to control the size of features formed on a substrate.

SUMMARY OF THE INVENTION

According to various embodiments, the present teachings include a method for forming a semiconductor device. The method can comprise forming a first feature and a second feature on a substrate by exposing a first mask to a first beam, wherein the second feature is disposed adjacent to the first feature, exposing a second mask to a second beam, and removing the second feature from the substrate.

According to various other embodiments, the present teachings include another method of forming a semiconductor device. The method can comprise forming at least one active feature on a substrate, forming at least one ghost feature on the substrate adjacent to a last active feature of the at least one active feature, and removing the at least one ghost feature from the substrate so as to form an array of active features.

According to various other embodiments, the present teachings include a computer readable medium containing program code that configures a processor to perform a method of making masks for forming features on a semiconductor device. The computer readable medium can comprise program code for forming a plurality of mask features on a first mask, wherein upon exposing the mask to a first beam the mask features form a plurality of features on a substrate, and program code for forming a second mask, wherein the second mask comprises a first opaque region that masks features in the plurality of features on the substrate from a second beam and that permits the second beam to impinge on at least one feature in the plurality of features.

According to various other embodiments, the present teachings include a computer readable medium containing program code that configures a processor to perform a method of making masks for forming an array of features on a semiconductor device. The computer readable medium can comprise program code for forming a first mask feature and a second mask feature adjacent to the first mask feature on a first mask and program code for forming a second mask to be used in conjunction with the first mask. The second mask can comprising a first region that blocks radiation and that corresponds to the first mask feature and a second region that permits radiation to impinge on the second mask feature.

According to various other embodiments, the present teachings include a mask set for use in the manufacture of an integrated circuit device. The mask set can comprise a first mask comprising a first mask feature and a second mask feature disposed adjacent to the first mask feature and a second mask comprising an opaque mask feature that is patterned to substantially correspond to the position of the first mask feature and a transparent mask feature that is patterned to substantially correspond to the position of the second mask feature.

According to various other embodiments, the present teachings include a semiconductor device made according to the method comprising exposing a first mask to a first beam and forming a first feature and a second feature on a substrate, wherein the second feature is disposed adjacent to the first feature. The method can also comprise exposing a second mask to a second beam and removing the second feature from the substrate.

According to various other embodiments, the present teachings include a semiconductor device made according to the method comprising forming at least one active feature on a substrate and forming at least one ghost feature on the substrate adjacent to a last active feature of the at least one active feature.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Figure 1A:
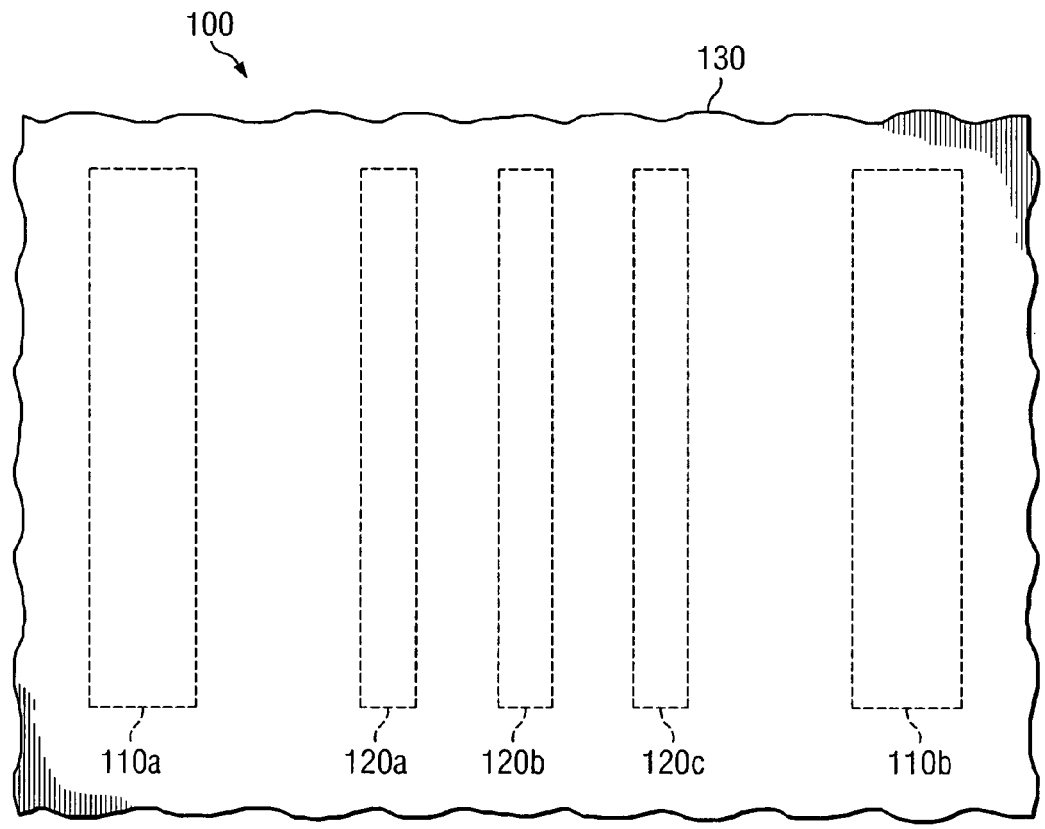
FIG. 1A depicts a portion of a conventional substrate.
Figure 1B:
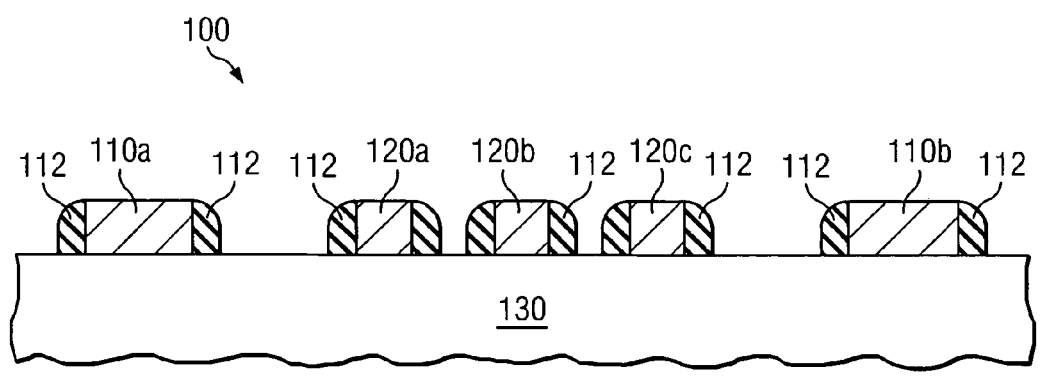
FIG. 1B depicts a portion of another conventional substrate.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Although reference is made herein to the use of the invention in the manufacture of semiconductor devices, such as ICs, it is to be understood that the invention has many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text can be considered as being replaced by the more general terms "mask", "substrate", and "target portion", respectively.

In the present disclosure, the term "radiation" is used to include all types of electromagnetic radiation, including ultraviolet radiation (e.g., with a wavelength of, for example, 365, 248, 193, 157, or 126 nm), extreme ultraviolet radiation (e.g., with a wavelength of, for example in the range of 5 to 20 nm), and to include electrons. The term "beam" is used to encompass various types of beams including beams of radiation and beams of electrons.

The term mask layout, as used herein, can be broadly interpreted as referring to a schematic used to make a semiconductor device. The mask layout is used to form a mask.

The term design, as used herein, can be broadly interpreted as referring to geometric shapes on the mask layout that correspond to mask features formed on a mask and/or features formed in/on the substrate.

The term mask, as used herein, can be broadly interpreted as referring to a device comprising mask features that can be used to endow an incoming beam with a patterned cross-section, corresponding to a target pattern, that is to be created in/on a target portion of a substrate.

The term feature, as used herein, can be broadly interpreted as referring to an element of a semiconductor device. Examples of a feature can include a gate, a gate bus, a well, an isolation structure, an interconnect line, a space, a contact hole, a pillar, a resistor, a ghost feature, or any other element of a semiconductor device or other device as will be understood by one of ordinary skill in the art.

The term mask feature, as used herein, can be broadly interpreted as referring to a geometric design on a mask. A mask feature can be used to pattern a feature on a substrate. Alternatively, a mask feature can be a resolution enhancement technique (RET) design, such as a sub-resolution assist feature (SRAF), or another optical proximity correction (OPC) technique that assists in forming a feature on the substrate but is not itself formed on the substrate. Still further, multiple mask features can be used to form structures on the substrate. The multiple structures, when finally formed, can combine to form a desired feature.

The term ghost feature (also referred to herein as ghost polysilicon, ghost poly, ghost gate, or ghost poly gate), as used herein, can be broadly interpreted as referring to a structure used to improve the critical dimension control when forming semiconductor devices by removing or minimizing the differences in OPC and responses to process variations. Ghost features can be structures initially formed on a substrate but later removed. In most cases, the ghost features are formed next to a feature that remains on the substrate. For example, a ghost feature, such as a ghost gate, can be formed at the end of a gate array so that the environment at the end of the gate array is similar to the environment in the interior of the gate array. Generally, the environment can include, for example, feature pitch and how well the printed feature size and/or shape conform to the intent of the original mask layout.

Ghost features can be used to reduce the critical dimension variation, such as, for example, for gates at the end of a gate array. For example, when using ghost gates, the critical dimension of gates at the end of the gate array (i.e., the last gate in an array for gates) can be from about 0% to about 10% more than the critical dimension of gates in the interior of the array. This is a significant improvement over current methods that do not use ghost features, where features, such as the last gates in the array, are two to three times the size of gates at the interior of the gate array. Moreover, because ghost features are removed from the wafer, they are not subject to further processing steps that include additional design restrictions and can lead to detrimental device interference.

Ghost features can be made of the same material as the other features concurrently formed. In the case of an array of gates made from a layer of polysilicon, for example, the ghost gate can be formed from the same layer of polysilicon. In other instances, however, where the layer is made of another material, such as a metal, a semiconductor, or an insulator, the ghost feature can be made of that material.

The term substrate as used herein can be broadly interpreted to include any suitable material, for example, single crystalline silicon, sapphire, gallium arsenide, polycrystalline materials, insulators, metals, or the like. The substrate may contain various features and various layers.

According to various embodiments a computer readable medium can be used to generate at least a portion of the integrated circuit. The computer readable medium can comprise program code that can configure a processor to perform various steps used to make the integrated circuit.

Figure 2A:
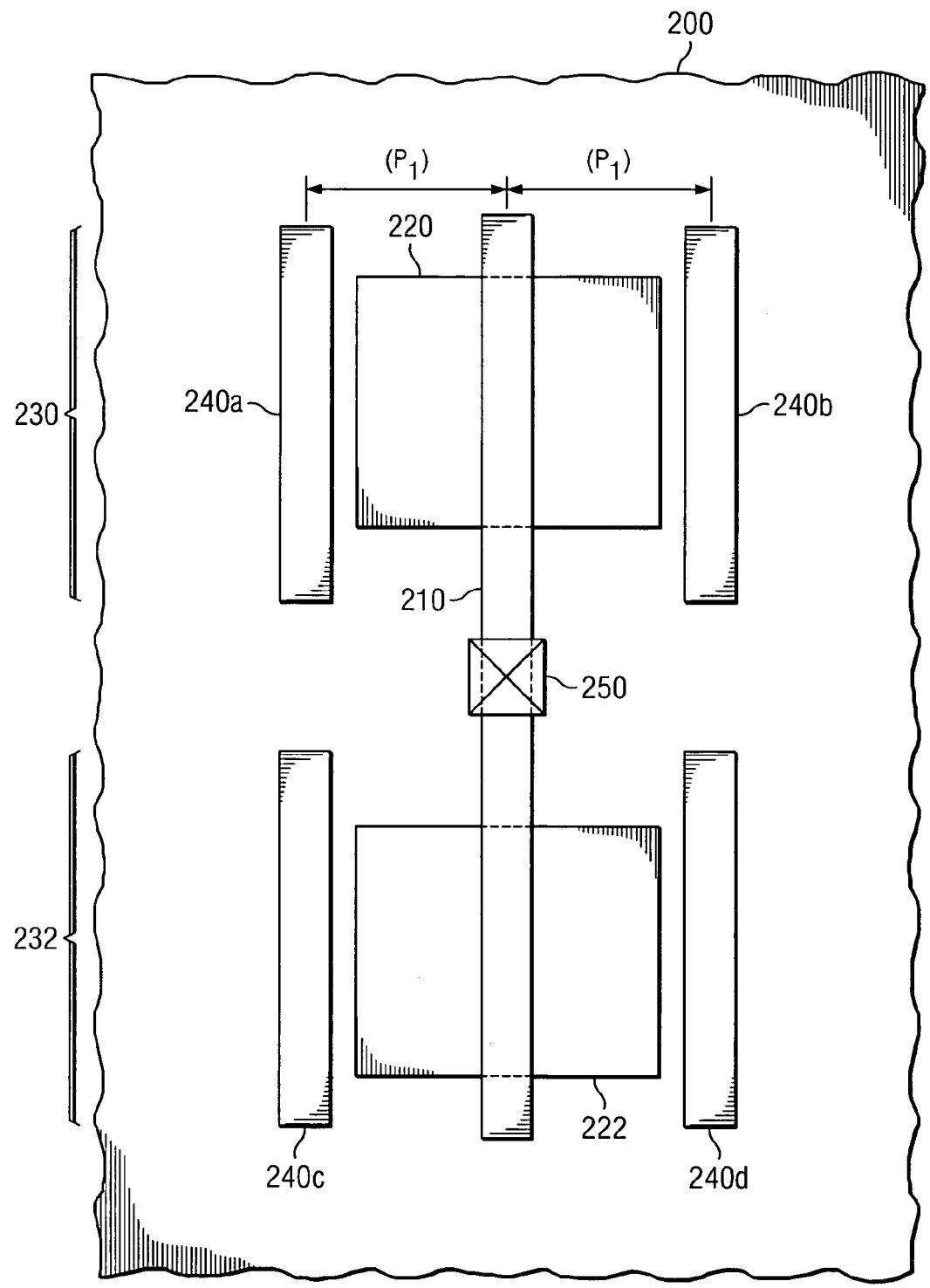
FIG. 2A depicts a portion of a first mask according to an embodiment of the invention.

FIGS. 2A-5 depict exemplary methods and devices that are used to form features on a substrate. Turning to FIG. 2A, a portion of a first mask 200 used at a poly level to make a CMOS device comprising an NMOS device 230 and a PMOS device 232 is shown superimposed onto a diagram of various CMOS features. First mask 200 comprises an active gate mask feature 210 and a plurality of ghost gate mask features 240a-d used to form active gates and ghost gates, respectively, on a substrate at a poly level. For ease of understanding, FIG. 2A shows active regions 220 and 222, which can be isolated by various structures, and contact hole 250, all of which may have already been formed or will be formed on the substrate. Moreover, while only active gate mask feature 210 is shown over each of the active regions 220 and 222, it is to be understood that an array of active gates can be formed over the active regions 220 and 222.

Ghost gate mask features 240a-d are used to form ghost gates on either side, and adjacent to the active gate formed by mask feature 210. For example, ghost gate mask features 240a and 240b form ghost gates on either side of the active gate formed by mask feature 210 in NMOS device 230. Similarly, ghost gate mask features 240c and 240d form ghost gates on either side of the active gate formed by mask feature 210 in PMOS device 232.

According to various embodiments, each gate in an array of gates can be formed at a predetermined pitch and the ghost gates can be formed at the same or different pitch away from an active gate. Pitch (also called contacted pitch) for the 45 nm logic node can be from about 160 nm to about 190 nm. For the 90 nm logic node, the pitch can be about 300 nm to about 360 nm. The embodiments of the invention described herein, are particularly well suited to logic nodes of less than about 1 μm.

Although shown as a single mask feature, active gate mask feature 210 can be other than a straight bar and can have, for example, a complex geometry made up of multiple shapes. The multiple shapes, when patterned onto the substrate, can combine to form a desired feature.

According to various embodiments, a beam can be directed at the first mask 200 to pattern features on the substrate. In particular, the active gate mask feature 210 patterns active gates on the substrate and the ghost gate mask features 240a-d pattern ghost gates adjacent to the active gates. In some embodiments, each of the ghost gates may be spaced at pitch ($P_1$) away from an active gate on the substrate, where the pitch ($P_1$) is the same pitch used for the gate spacing in an array of active gates. In a next step, the pattered features can be formed on the substrate by various techniques.

For example, in certain embodiments, a first layer, including at least one of a hardmask and a poly layer, can be formed on a substrate and a photoresist layer can be formed on the first layer. In this case, a beam is used to transfer the pattern of the mask features, such as the active features (i.e., those that will remain on the substrate) and the ghost features, of the first mask to the photoresist. The photoresist is then exposed and developed. Next, the active features and the ghost features in the photoresist are patterned to the first layer, such as by etching. The photoresist may then be removed. In the case where the first layer comprises a hardmask and a poly layer, the active features and the ghost features in the photoresist can be transferred to the hardmask and then transferred to the poly. Alternatively, when only a photoresist and poly layer are used, the active features and the ghost features in the photoresist can be transferred directly to the poly layer.

In other embodiments, active features and ghost features can be patterned in a photoresist layer on a poly layer on the substrate using the first mask. For example, a beam is used to transfer the active mask features and the ghost mask features of the first mask to the photoresist. This step establishes images of the active features and ghost features in the photoresist. In this case, however, the patterned photoresist layer is not developed. The ghost mask features correcting for variability in the active features.

Figure 2B:
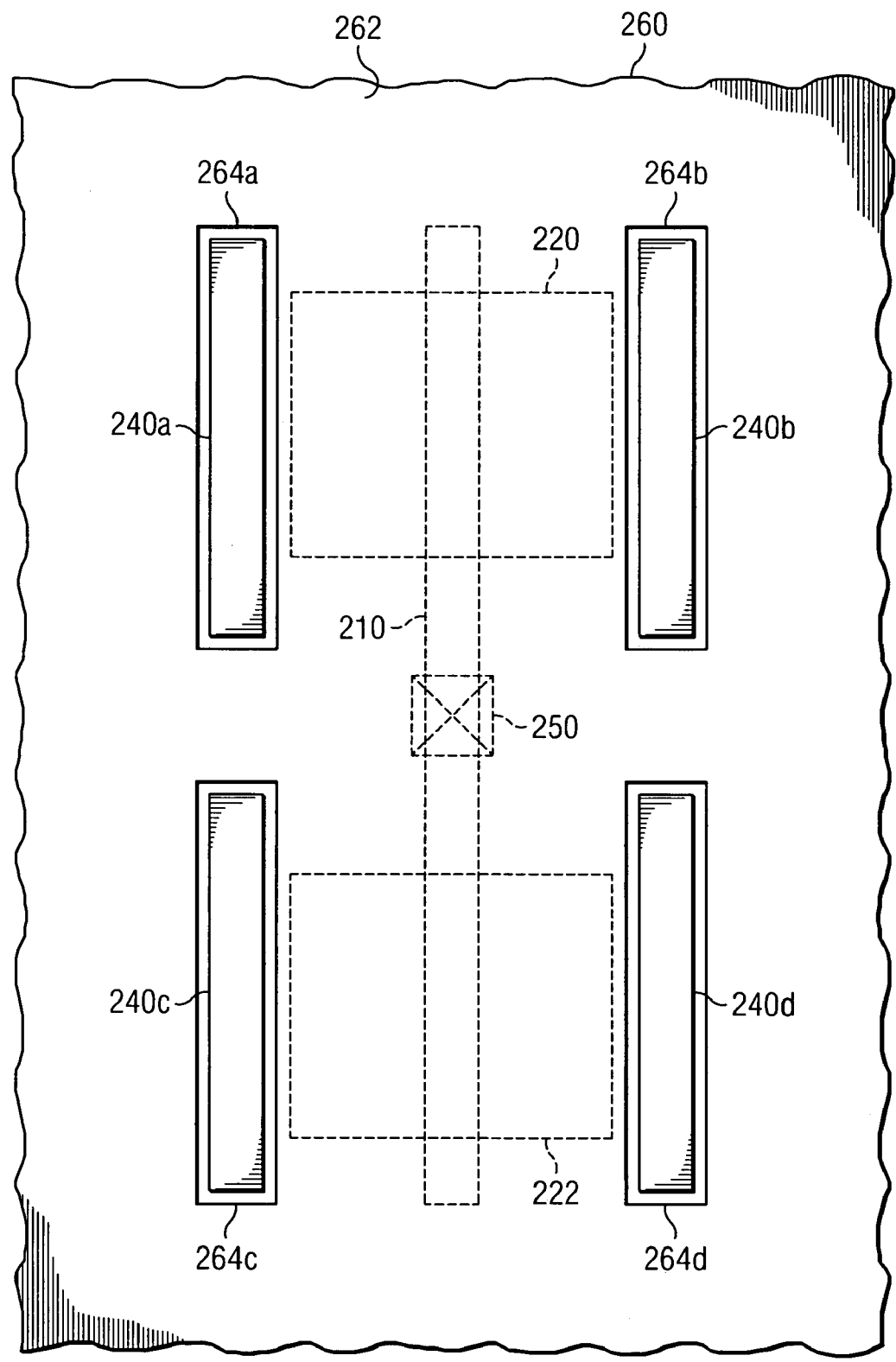
FIG. 2B depicts a portion of a second mask used in conjunction with the first photolithography mask of FIG. 2A.

FIG. 2B shows a portion of a second mask 260 used in a next step in the fabrication of the CMOS device begun using the first mask 200. For ease of understanding, FIG. 2B also shows the mask features and other features shown in FIG. 2A. In cases where the photoresist is developed and the features are transferred from the photoresist to the poly layer, the mask features of the second mask 260 are patterned to be aligned over the respective features formed using the first mask 200. The beam can be directed at the second mask 260 so as to either mask or expose the existing features on the substrate. For example, the second mask 260 comprises an opaque mask feature 262 that masks the gates 210 formed over active areas 220 and 222. The second mask 260 also comprises transparent mask features 264a-d that allow the beam to expose the ghost gates formed on the substrate. In particular, the second opaque mask feature 262 on the mask 260 shields the gates 210 and contact hole area 250 on the substrate from the beam but the transparent mask features 264a-d allow the beam to expose the ghost gates. It is to be noted that the beam directed at the second mask 260 can be the same or different from the one directed at the first mask. In a next step, the exposed ghost gates can be removed from the substrate, for example, using various etching techniques as will be known to one of ordinary skill in the art.

In cases mentioned above where the photoresist is not developed, the ghost gates are exposed using the second mask and their pattern is thereby erased from the substrate. There is no need in this case for the intermediate transfer process, as described above. As such, the second mask exposure prevents the ghost gates from appearing on the wafer.

Generally then, the first mask 200 can be used to pattern a plurality of features on the substrate, including an active gate (including an array of active gates), ghost gates formed adjacent to the active gate, contact holes, etc. The ghost gates are spaced from the active gates, such as at the same or different pitch than gates in an array are spaced. Using the ghost gates allows the beam exposing the first mask to accurately form the gates in the array. The second mask 260 can then be used to expose the ghost gates to a beam while also preventing other areas of the substrate from being exposed. In this way, the ghost gates are removed from the substrate. Thus, the final substrate has active gates that are each correctly sized and accurately spaced from each other. The final substrate does not have ghost gates thereon.

Figure 3A:
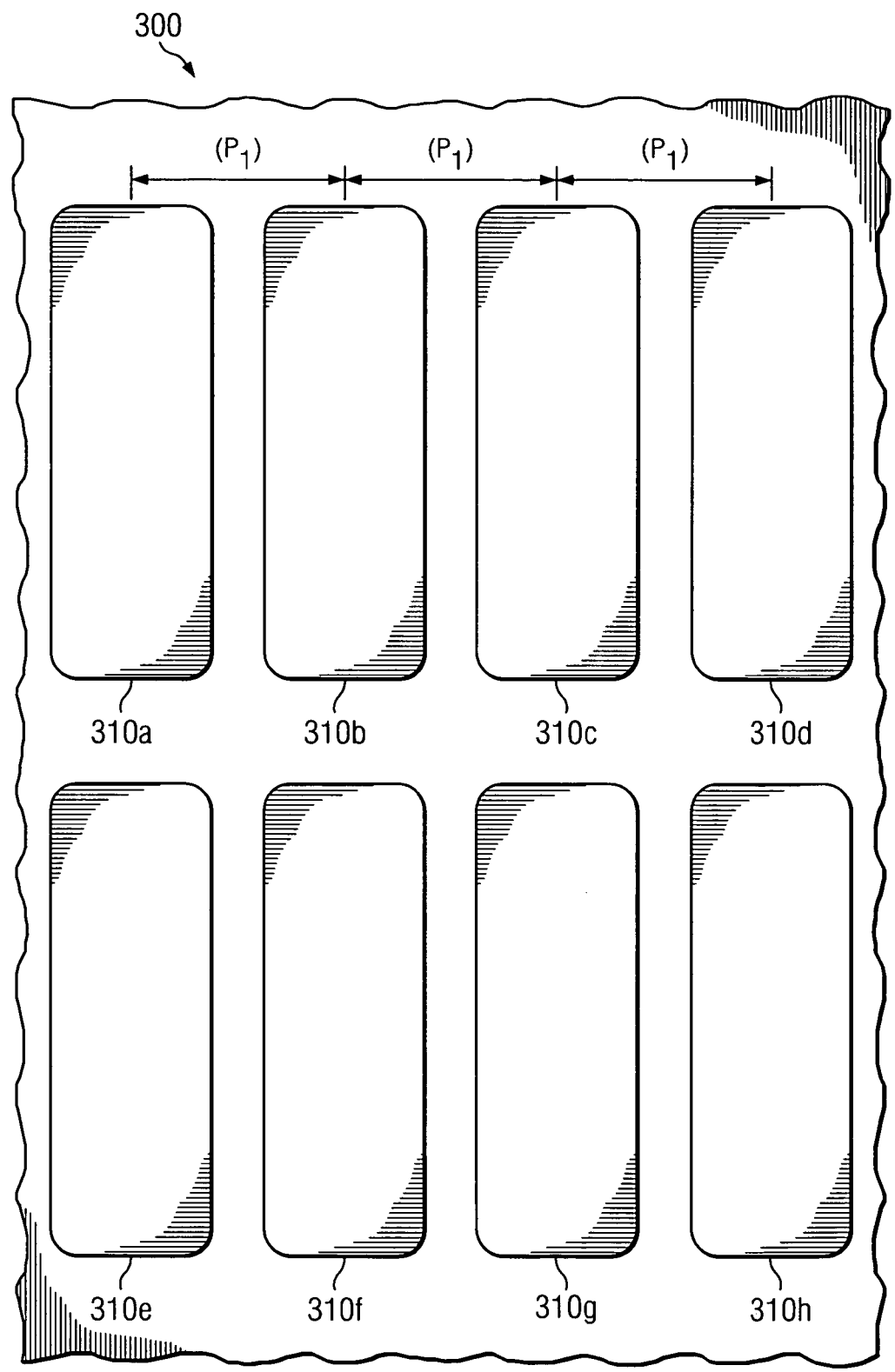
FIG. 3A depicts a portion of a substrate during fabrication according to another embodiment of the invention.

FIGS. 3A-3G show various steps in another embodiment that uses ghost features to improve feature accuracy on a substrate. FIG. 3A shows a portion of a substrate 300. The substrate can comprise a hardmask layer (not shown) formed over a poly layer formed over the substrate and a photoresist layer 302 formed over the hardmask layer. FIG. 3A shows, for example, the substrate 300 with a post-develop resist pattern and etched hardmask. The pattern shown in FIG. 3A includes features 310a-h. Each of the features 310a-h may be spaced from each other at a pitch ($P_1$). Features 310a-h can be patterned in photoresist layer 302 so as to open areas of substrate 304. Exemplary hardmask materials can include SiON, SiN, $SiO_2$, as well as other materials known to one of ordinary skill in the art.

Figure 3B:
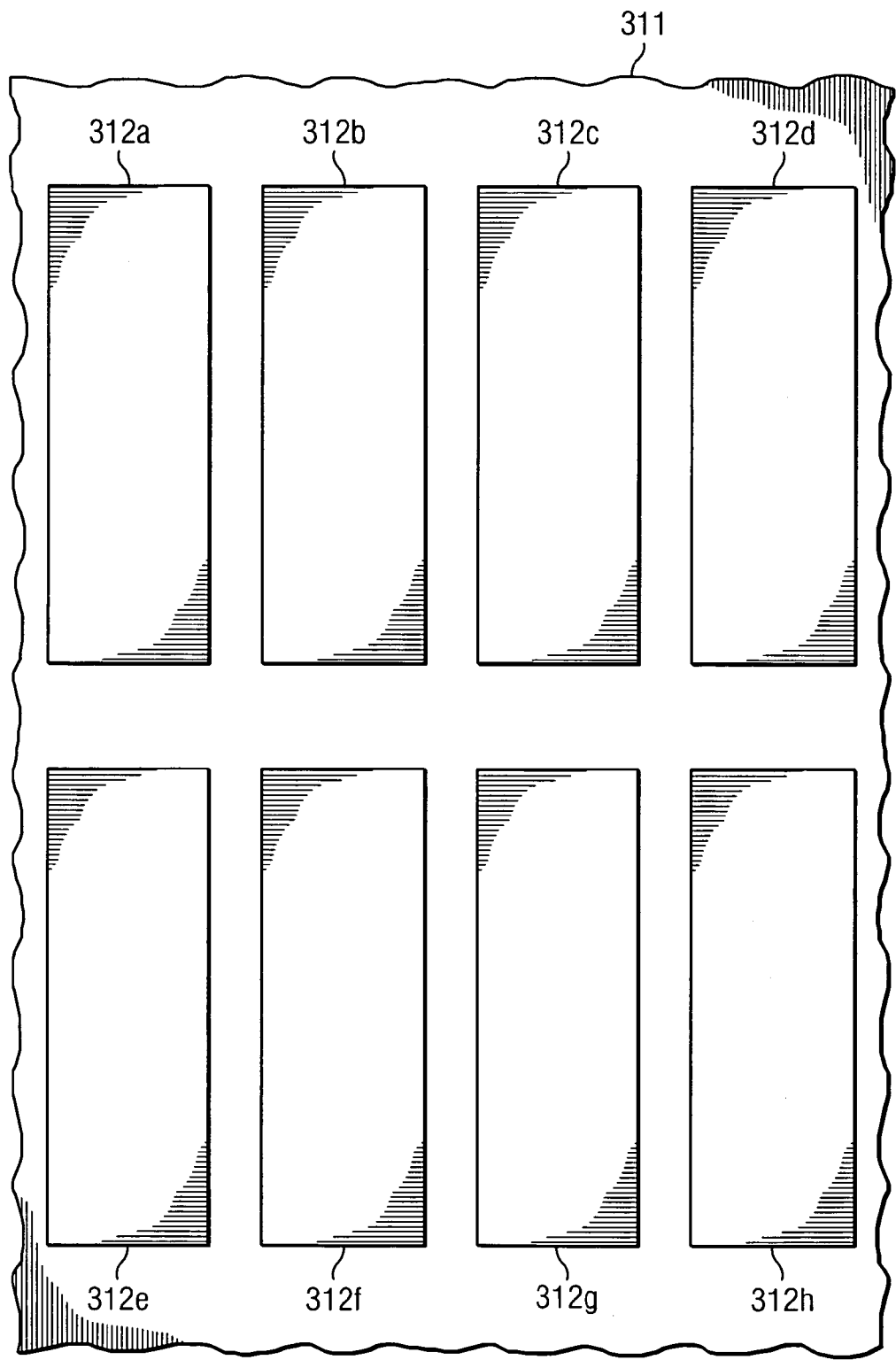
FIG. 3B depicts a portion of a first mask according to another embodiment of the invention.

The photoresist 302 can be patterned using a first mask, such as mask 311 shown in FIG. 3B having mask features 312a-h corresponding the features 310a-h. After using a beam to pattern the photoresist layer 302, the features can be etched into the underlying hardmask disposed over the poly layer over the substrate.

Figure 3C:
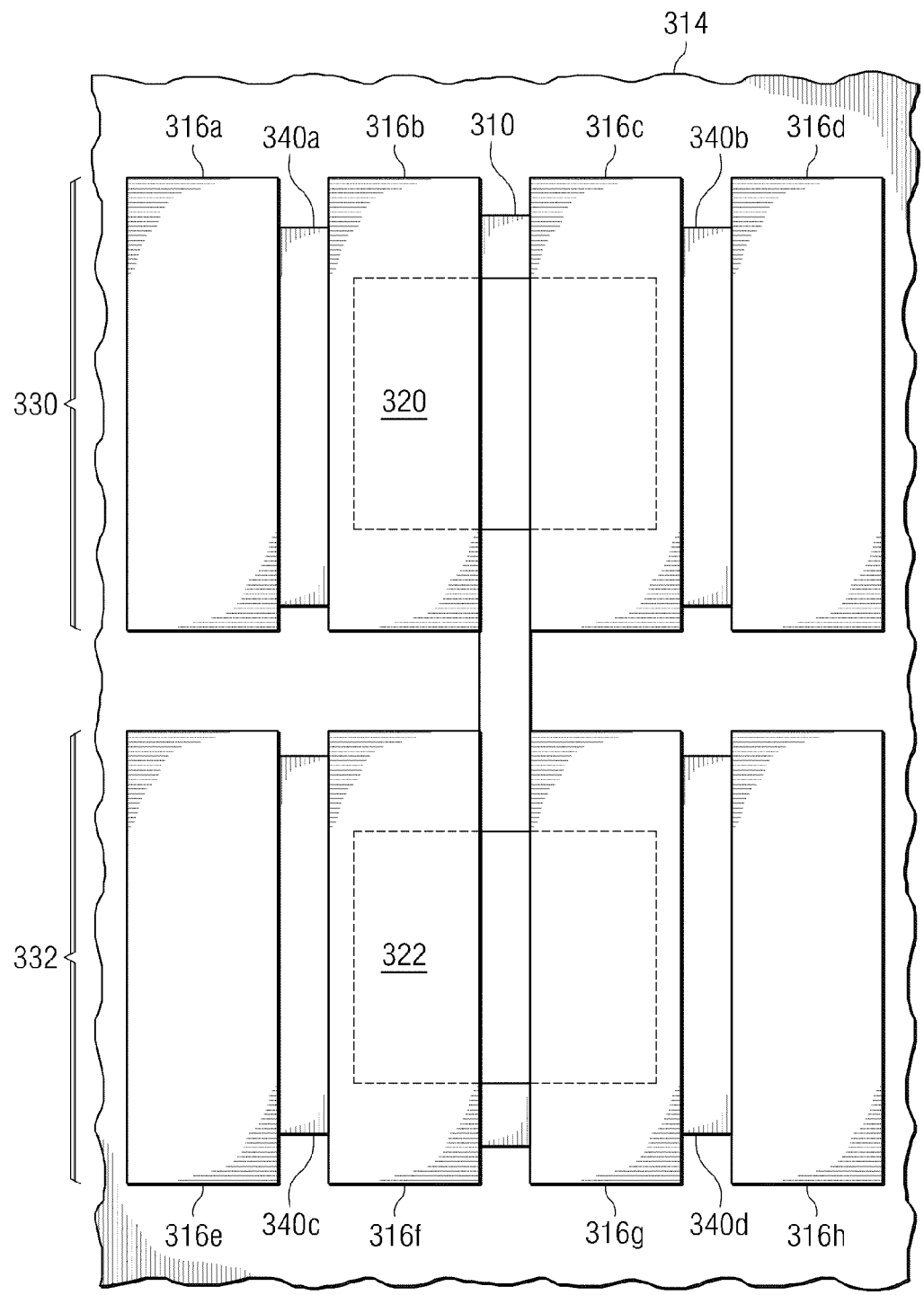
FIG. 3C depicts a portion of an alternating phase shift mask according to another embodiment of the invention.

FIG. 3C shows an alternative first mask 314 according to an embodiment where the mask features 316a-h can be made to form an alternating phase shift mask (altPSM). In FIG. 3C, altPSM 314 is shown overlain onto a diagram of the features formed on the substrate, including active gate 310, active regions 320 and 322 of an NMOS device 330 and a PMOS device 332, respectively, and ghost gates 340a-d. Features 316a, c, f, and h can transmit light having a first phase, such as zero, and features 316b, d, e, and g can transmit light having a second phase, out of phase from the first phase, for example, by π. According to various embodiments, a mask layout can indicate a needed ghost mask feature in the form of diffraction support on the mask. Diffraction support is similar to a ghost mask feature but described in k-space. The need for diffraction support can arise, for example, when end gates respond differently than interior gates to process parameters and OPC because of the image formed by different diffraction patterns in lenses used in photolithography. The addition of a ghost feature in the form of diffraction support can make the diffraction pattern for the end gate look like that of the interior gate.

Figure 3D:
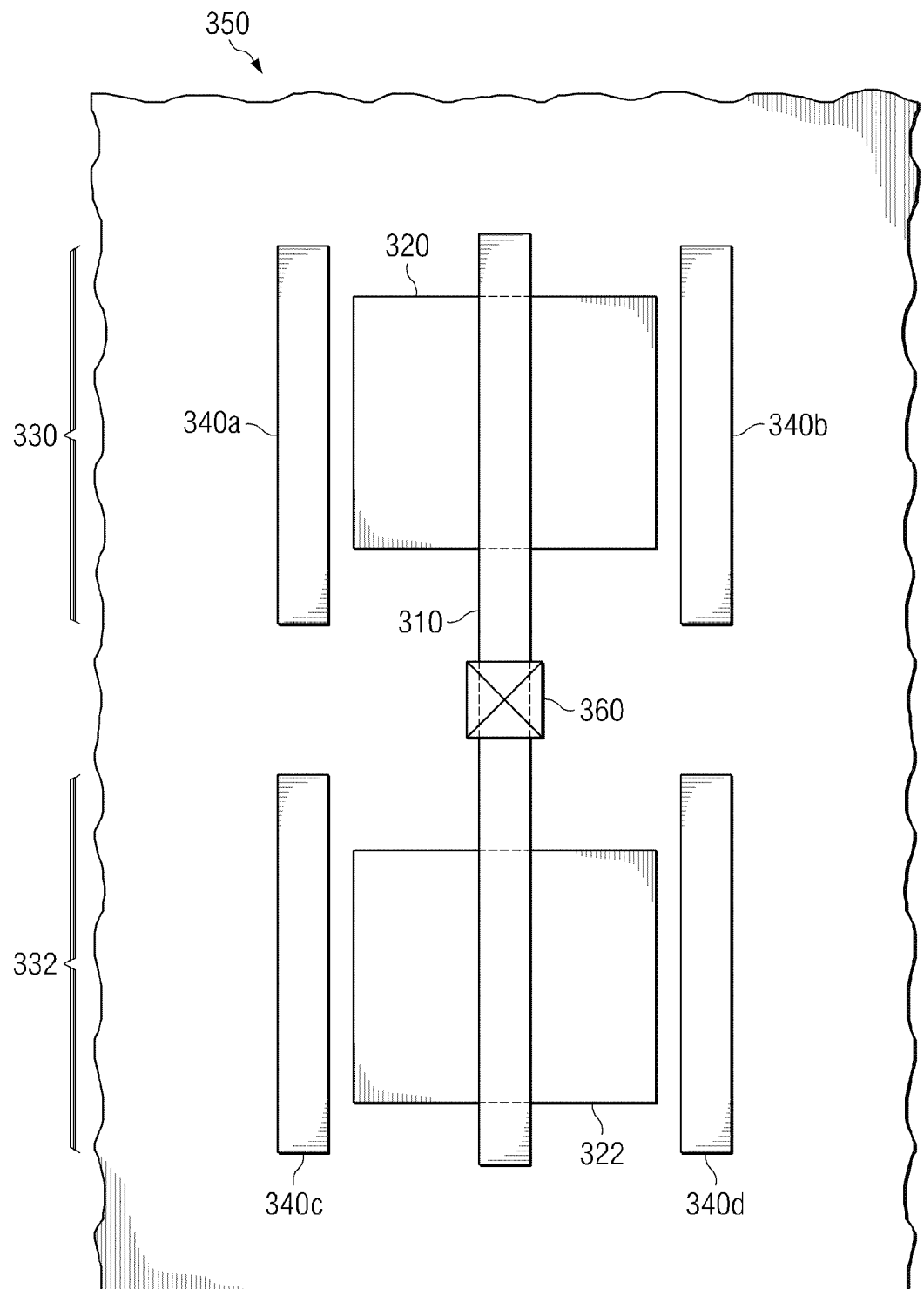
FIG. 3D depicts a portion of a substrate patterned using the first mask of FIG. 3B or FIG. 3C.

FIG. 3D is a depiction of the substrate 350 after the mask features on the mask 311 or altPSM 316 have been exposed and etched. Shown in FIG. 3D are substrate 350, active gate 310, active regions 320 and 322 of the NMOS device 330 and the PMOS device 332, respectively, ghost gates 340a-d, and contact hole 360. Contact hole 360 may not actually be formed at this point but is represented herein for ease of understanding. According to various embodiments the active gate 310 and the ghost gates can be formed in a patterned polysilicon layer by removing unwanted poly. The ghost gates 340a-d are adjacent to, and spaced at a pitch, such as ($P_1$) or some other pitch, from active gate 310.

Figure 3E:
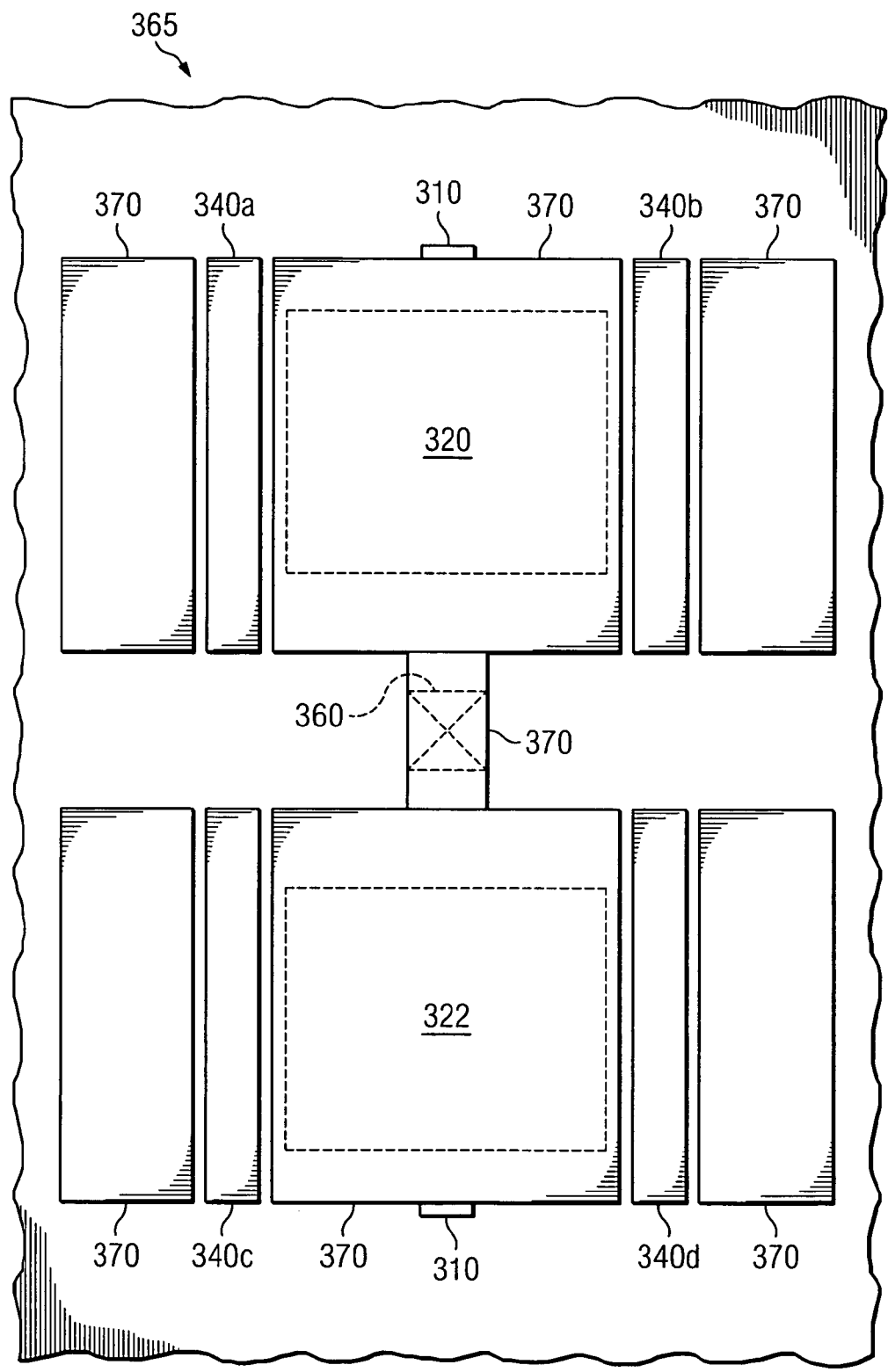
FIG. 3E depicts a portion of a second mask used in conjunction with the first mask of FIG. 3B or FIG. 3C.

FIG. 3E shows a trim mask 365 overlain onto the features formed on the substrate. It is to be understood that for ease of understanding, FIG. 3E shows various features that may or may not be formed on the substrate at this stage of processing. Trim mask 365 has regions 370 that are opaque to a beam so as to mask portions that are to remain on the substrate. Mask 365 also has regions corresponding to the ghost gates 340a-d formed on the substrate that are transparent to the beam. A photoresist layer is applied to the substrate and the trim mask 365 is used to pattern the photoresist layer. In a next step, shown in FIG. 3F, the patterned photoresist is then etched into the hardmask. According to various embodiments, the trim mask 365 can also be used to reduce the width of the active gate 310 by removing unwanted poly.

Alternatively, FIG. 3A depicts a patterned photoresist formed over a poly layer formed over the substrate. In this case, the first mask 311 or 314 shown in FIG. 3B or FIG. 3C was used to transfer the mask features to the photoresist. This can form ghost features and active features in the photoresist. In this embodiment, the second mask can be used to direct a beam onto the ghost features, thereby destroying their image in the photoresist. The second mask also prevents the beam from impinging the active features, thereby preserving their image in the photoresist. The photoresist, without the ghost feature images, can be developed and the features formed therein can be transferred to the underlying layer, such as the poly layer. Thus, the first mask uses ghost mask features to accurately form the active features in the photoresist, and when they are no longer needed, the ghost features are erased using the second mask.

Figure 3F:
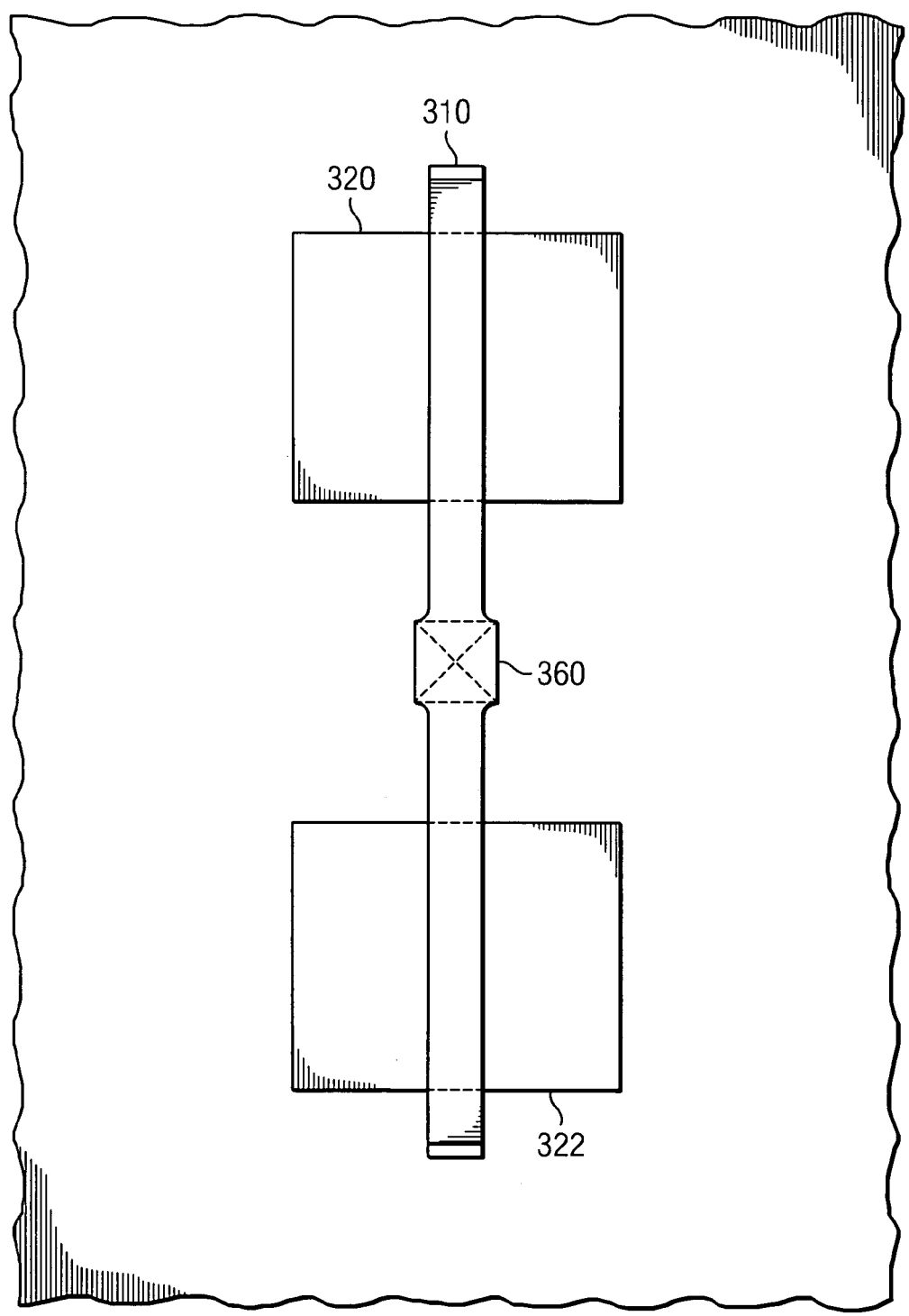
FIG. 3F depicts a portion of the substrate patterned using the first mask of FIG. 3B or the alternating phase shift mask of FIG. 3C.

FIG. 3F shows the substrate after the ghost gates have been removed. The substrate comprises the active gate 310 formed over the active regions 320 and 322 and contact hole 360. Forming the ghost gates on the substrate allows the active gate to be formed accurately on the substrate. Moreover, because the ghost gates are removed, they do not detrimentally affect the final device.

Figure 4A:
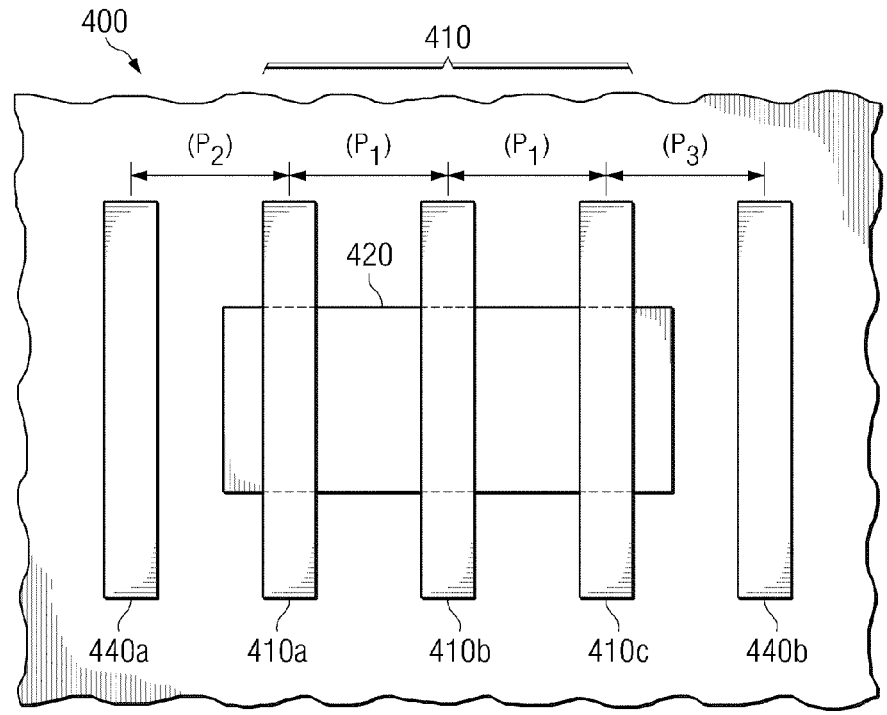
FIG. 4A depicts a portion of a substrate during processing according to an embodiment of the invention.
Figure 4B:
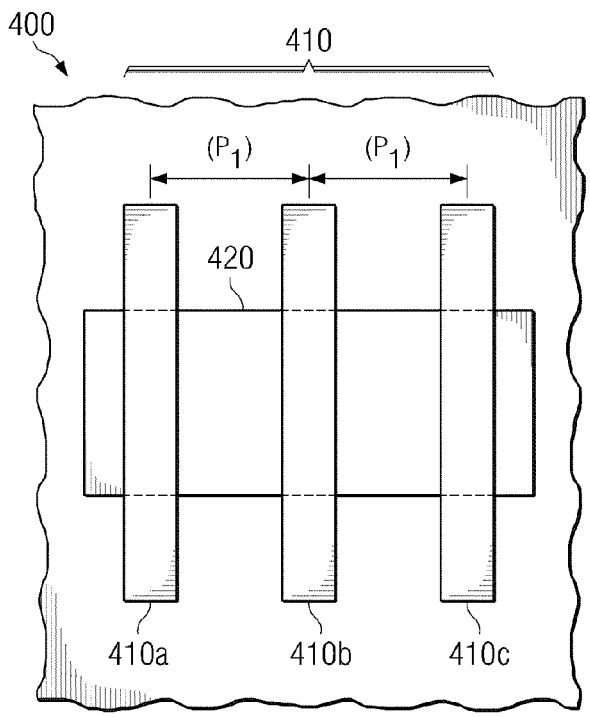
FIG. 4B depicts a portion of the substrate of FIG. 4A during a later step in the process.

FIGS. 4A-4B depict a top down view of a substrate 400 during a portion of a fabrication process according to various embodiments of the invention that use ghost gates. FIG. 4A depicts a portion of substrate 400 comprising an array 410 of active gates 410a-c, an active region 420, and ghost gates 440a-b. While array 410 shown in FIG. 4A comprises three active gates, it is contemplated that away 410 can comprise less than, or more than, three active gates. According to various embodiments the active gates and the ghost gates can be formed in a patterned polysilicon layer. Active gates 410a-c are spaced from each other at a pitch (P1). Active gate 410a can be considered the last active gate on the left side of the array 410 and active gate 410c can be considered the last active gate on the right side of the array 410. Ghost gate 440a is positioned adjacent to the active gate 410a, which is the last active gate in the array 410, at pitch (P2). Similarly, ghost gate 440b is positioned adjacent to the active gate 410c, which is also the last active gate in the away 410, at pitch (P3). Active region 420 can be either an n-type region or p-type region in which a device is formed. According to various embodiments, pitch (P1) can be the same or different than pitch (P2) and/or pitch (P3) and pitch (P2) can be the same or different than pitch (P3). In the embodiment of FIG. 4A, pitch (P2) and pitch (P3) are made the same as pitch (P1).

FIG. 4B shows the substrate 400 in a later step of the fabrication process. As shown in FIG. 4B, the ghost gates 440a-b have been removed from the substrate 400. According to various embodiments, the ghost gates 440a-b can be removed before further processing of the active gates have taken place, such as before sidewall spacers have been formed on the active gates or before the active gates are contacted by a metal layer. The portion of substrate 400 now comprises the active gates 410a-c spaced at the pitch $(P_1)$ and the active region 420.

Figure 5:
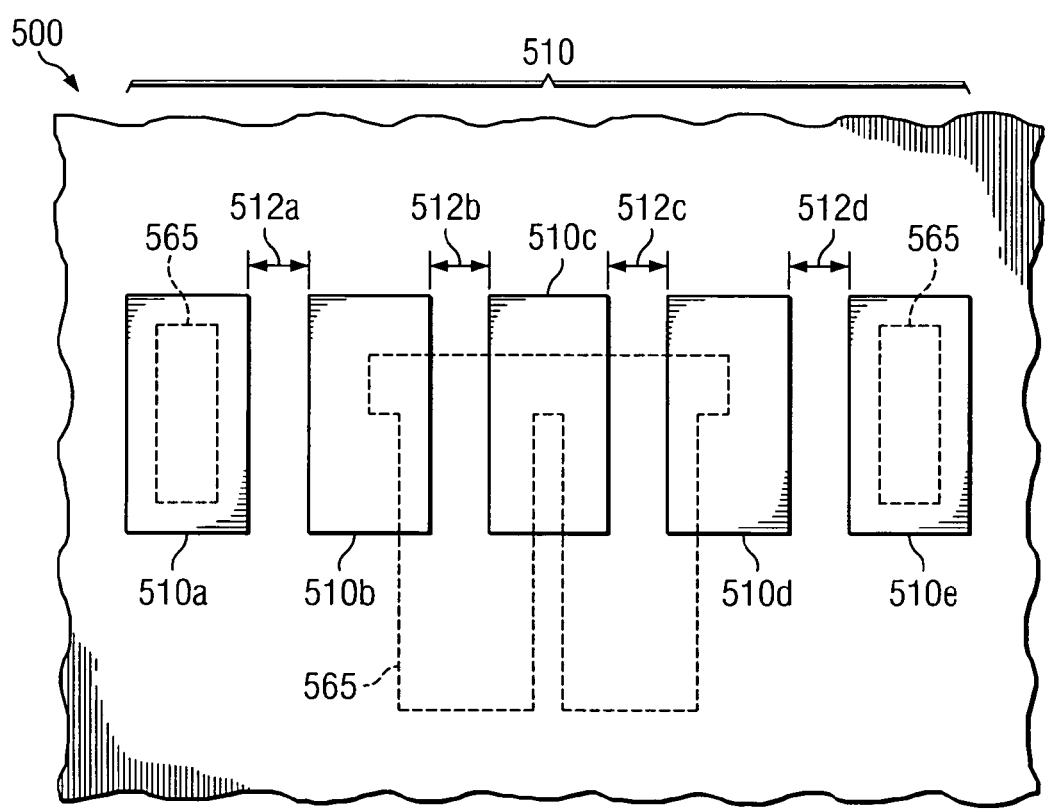
FIG. 5 depicts a portion of a substrate and a mask during processing according to an embodiment of the invention.

FIG. 5 depicts a top down view of a portion of an alternating phase shift mask superimposed onto a portion of a substrate 500. The top down view is shown during a portion of a process according to various embodiments of the invention that use ghost gates. The altPSM comprises an array 510 of phase shift apertures 510a-e. An active gate is formed in the space 512b between phase shift apertures 510b and 510c and an active gate is formed in the space 512c between the phase shift apertures 510c and 510d. While array 510 shown in FIG. 5 comprises spaces for two active gates, it is contemplated that array 510 can comprise less than, or more than two apertures that permit spaces for active gates. According to various embodiments the active gates and the ghost gates can be formed in a polysilicon layer. The active gates can be spaced apart from each other at a pitch, such as pitch $(P_1)$ or at varying pitches. The active gate formed in space 512b can be considered the last active gate on the left side of the array of active gates and the active gate formed in space 512c can be considered the last active gate on the right side of the array of active gates. A ghost gate can be formed in space 512a between phase shift apertures 510a and 510b and a ghost gate can be formed in the space 512d between the phase shift apertures 510d and 510e. According to various embodiments, the ghost gate formed in space 512a can be positioned adjacent to the active gate formed in space 512b at the pitch $(P_2)$. Similarly, the ghost gate formed in space 512d can be positioned adjacent to the active gate formed in the space 512c at a pitch $(P_3)$. According to various embodiments, pitch $(P_1)$ can be the same or different than pitch $(P_2)$ and/or pitch $(P_3)$ and pitch $(P_2)$ can be the same or different than pitch $(P_3)$.

Also shown in FIG. 5 is a trim mask 565 overlain on the substrate 500. Trim mask 565 is used to expose and pattern a resist (not shown) formed over the substrate. The patterned resist can then be etched into a hardmask (not shown). In a subsequent step, the exposed regions of substrate 500 can be removed. In this manner, the ghost gates are removed and active gates can be trimmed and patterned. According to various embodiments, the trim mask 565 can be an altPSM.

According to various embodiments there is another method of using ghost features to improve the critical dimension control when forming integrated circuits by removing or minimizing the differences in OPC and responses to process variations. For example, there is a double-exposure process where a first mask is exposed to pattern active gates and ghost features on a substrate, similar to that described above. Using a second mask, the ghost features can be exposed away and thereby removed from the substrate without the need for an intermediate transfer process. In this case, a photoresist need not be developed between the first exposure that exposes the first mask and the second exposure that exposes the second mask. Rather, the second exposure can prevent the ghost feature from appearing on the wafer in subsequent process steps. Subsequently, the wafer can be processed as will be understood by one of ordinary skill in the art. In this way, accurate features can be formed on the substrate and ghost features do not appear on the final device.

According to various embodiments a computer readable medium containing program code is provided that configures a processor to make a mask for forming an array of features on a substrate used as a semiconductor device. The program code can comprise program code for forming a plurality of mask features on a first mask. According to various embodiments, the mask features can comprise active gate mask features and ghost mask features. When the first mask is exposed to a first beam, such as a light source, the corresponding features are patterned into a photoresist that is formed on the substrate. In some cases, the patterned features in the photoresist can be etched into a hardmask or into a poly layer. The features can comprise an array of active gates and ghost gates. The ghost gates can be formed adjacent to a last active gate in the array of active gates. Moreover, the active gates can be spaced from each other at a pitch of $(P_1)$. The ghost gates can also be spaced from the corresponding last active in the array at the same of different pitch.

According to various embodiments, there is also included program code for forming a second mask. The second mask can comprise a first opaque region that masks the array of active gates from a second beam, such as a light source. The second mask can also comprise a transparent region that permits the second beam to impinge on at least one feature formed in the hardmask or poly, such as at least one ghost gate. Alternatively, the second mask can be used to expose the images of the ghost features in a photoresist and thereby erase the ghost feature images. In any case, the ghost features are not left on the substrate.

According to various embodiments at least one of the first mask and the second mask can be an altPSM.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A computer readable medium containing program code that configures a processor to perform a method of making masks for forming an array of features on a semiconductor device, comprising:
    program code for forming a first mask feature on a first mask to provide a first feature in the array of features on the semiconductor device and a second mask feature on the first mask adjacent to, and spaced from, the first mask feature to provide a second feature adjacent to, and spaced from, the first feature in the array of features on the semiconductor device; and
    program code for forming a second mask to be used in conjunction with the first mask, the second mask comprising,
        a first region that blocks radiation and that corresponds to the first mask feature and the first feature in the array of features on the semiconductor device, and
        a second region that permits radiation to impinge on an entirety of the second feature in the array of features on the semiconductor device.

2. The computer readable medium containing program code that configures a processor to perform a method of making masks according to claim 1, wherein the second mask feature forms a ghost feature on a substrate.

3. The computer readable medium containing program code that configures a processor to perform a method of making masks according to claim 2 further comprising:
    program code for forming a plurality of first mask features, where each of the first mask features are spaced from each other at a first pitch, and wherein the ghost mask feature is spaced from the one of the first mask features by a second pitch.

4. The computer readable medium containing program code that configures a processor to perform a method of making masks according to claim 3, wherein the first pitch is the same as the second pitch.

5. The computer readable medium containing program code that configures a processor to perform a method of making masks according to claim 1, wherein the program code for forming the first mask forms an alternating phase shift mask.

6. The computer readable medium containing program code that configures a processor to perform a method of making masks according to claim 1, wherein the first mask feature on the first mask patterns a first gate on the substrate, the second mask feature on the first mask patterns a second gate on the substrate, and the second region of the second mask is provided to allow complete removal of the second gate from the substrate.

* * * * *

UNITED STATES PATENT AND TRADEMARK OFFICE
CERTIFICATE OF CORRECTION

| | | |
|---|---|---|
| PATENT NO. | : 7,569,309 B2 | Page 1 of 1 |
| APPLICATION NO. | : 11/269633 | |
| DATED | : August 4, 2009 | |
| INVENTOR(S) | : Blatchford et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 786 days.

Signed and Sealed this

Seventh Day of September, 2010

David J. Kappos
*Director of the United States Patent and Trademark Office*